United States Patent
Guedj

(10) Patent No.: US 6,404,679 B1
(45) Date of Patent: Jun. 11, 2002

(54) MULTIPLE LEVEL FLOATING-GATE MEMORY

(75) Inventor: Marc Guedj, Pont Saint-Esprit (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/453,753

(22) Filed: Dec. 2, 1999

(30) Foreign Application Priority Data

Dec. 4, 1998 (FR) .............................................. 98 15461

(51) Int. Cl.[7] .............................................. G11C 16/06
(52) U.S. Cl. .............................. 365/185.21; 365/185.03; 365/185.2
(58) Field of Search ....................... 365/185.21, 185.03, 365/185.19, 185.2, 189.07, 189.09

(56) References Cited

U.S. PATENT DOCUMENTS

| 5,262,984 | A | * | 11/1993 | Noguchi et al. ............ 365/185 |
| 5,386,158 | A | * | 1/1995 | Wang ........................... 327/51 |
| 5,394,362 | A | * | 2/1995 | Banks .................... 365/189.01 |
| 5,550,772 | A | * | 8/1996 | Gill ........................ 365/185.03 |
| 5,574,879 | A | * | 11/1996 | Wells et al. ................. 395/427 |
| 5,828,601 | A | * | 10/1998 | Hollmer et al. .......... 365/185.2 |
| 5,910,914 | A | * | 6/1999 | Wang .................... 365/185.21 |
| 5,973,957 | A | * | 10/1999 | Tedrow ................. 365/185.03 |
| 6,097,637 | A | * | 1/2000 | Bauer et al. ........... 365/185.24 |

* cited by examiner

Primary Examiner—Richard Elms
Assistant Examiner—Tuan T. Nguyen
(74) Attorney, Agent, or Firm—Lisa K. Jorgenson; Allen, Dyer, Doppelt, Milbrath & Gilchrist, P.A.

(57) ABSTRACT

A circuit and method for reading a multiple-level floating-gate memory is provided. The reading is done by a gate bias voltage VP that is equal to the voltage needed to obtain a predetermined reference current Iref in the selected storage transistor. The decoding of the stored data element is done by the decoding of the bias voltage VP. Thus the circuit and method reduces the current flowing through the transistors during the reading and reduces the mean electrical stress undergone during each read operation.

26 Claims, 6 Drawing Sheets

MULTIPLE LEVEL FLOATING-GATE MEMORY

FIELD OF THE INVENTION

The invention relates to a multiple-level floating-gate memory, and more particularly, the invention relates to a memory in which the basic storage element is a floating-gate transistor that must store a piece of information whose value can take one of at least three states.

BACKGROUND OF THE INVENTION

Multiple-level floating gate memories are used to increase storage capacity without increasing the surface area of the storage matrix. This principle has been disclosed, for example, in the applications EP-A-0 340 107 (D1 here below) and EP-A-0 656 628 (D2 here below). The standard memories generally store one bit, namely two electrical levels, per storage element. The multiple-level memories store a larger number of electrical levels. Thus, when a multiple-level memory with four electrical levels is made, this allows the storage of two bits per storage element, the storage capacity in this case being doubled for one and being the same matrix size.

To obtain the different electrical levels, the floating gate of the storage transistor is charged in varying degrees. The gate that is charged in varying degrees has the effect of bringing about a variation in the conduction threshold voltage of the storage transistor. In order to write in such cells, a sequence of programming/reading/verification cycles is performed until the desired programming level is obtained. The reading is done by applying a read voltage to the storage transistor which makes this transistor more conductive or less conductive depending on the charge present at the floating gate. The channel of the storage transistor is connected to a load which converts the current flowing through the storage transistor into a voltage. The voltage is then compared to different thresholds to determine the stored state.

However this type of memory has drawbacks. Two of these drawbacks are, firstly, high power consumption and, secondly, risk of deterioration of the data. The high consumption is due, inter alia, to the voltages and currents used during reading operations. Indeed, during a reading operation, the transistors are biased to obtain different currents in their drain-source channel, with the current representing the stored information. Now, to have better readability of the different values stored, read currents are used with values three times greater than in the case of standard floating-gate memories.

The structure of a multiple-level memory matrix is the same as that of a standard memory matrix. FIG. 1 shows the current-voltage curve of a bit line with a given basic bias voltage. The curve of FIG. 1 results from different programming levels for a given bias of the bit line. The reading is then done either in current or in voltage. The currents IR1, IR2 and IR3 represent the current thresholds that differentiate the storage levels. For further details, those skilled in the art may refer, for example, to D1.

The risk of deterioration of the data arises from the use of several data thresholds which increases the risks of deterioration of the data stored in a floating-gate transistor. The risk of deterioration of the data is also increased by the greater electrical stress undergone by each storage transistor. Indeed, the use of several programming levels requires the use of a substantial gate bias voltage (of about 4 to 6 volts). This favors charge migrations. The phenomenon is further accentuated during the reading of a highly conductive storage transistor.

FIG. 2 shows an example of characteristic curves of current going through the channel of a storage transistor as a function of the bias voltage, for the storage thresholds. In this example, the threshold current IR3 corresponds substantially to the conduction current of the storage transistor at the beginning of the state when the conduction is linear. This current IR3 corresponds to the threshold current used for a binary type of memory. Those skilled in the art can see that the spacings between the characteristics corresponding to the different thresholds do not follow a linear pattern. This stepped feature is partly due to the stress on the memories. Indeed, the first threshold characteristic 1 corresponds to the characteristic curve used for a binary type memory. It is difficult to shift this characteristic because it is far too low. This leads to a continuous conduction of the storage transistor (giving rise to malfunctioning for Flash-EEPROM type memories).

The second and third characteristics 2 and 3 are shifted to have high readability between the programming levels. Furthermore, to obtain a reading, it is appropriate to bias the bases of the storage transistors at a voltage such that all the programming levels can be read. The bias voltage therefore corresponds to the voltage that produces the threshold current IR3 for the third characteristic 3. This bias voltage brings about a correspondence of the bigger currents for the first and second characteristics 1 and 2.

In the example shown, the bias voltage is set at 4.5 VT with VT corresponding to the conduction voltage of an N channel MOS transistor, namely about 1.1 V. Now this bias voltage corresponds to about half the erasure voltage (or programming voltage) of certain storage transistors. Those skilled in the art will appreciate that the current flowing in the channel of the transistors whose programming corresponds to the levels "11" or "10" is fairly great and that a low-amplitude Fowler Norheim effect can occur. The likelihood of this effect occurring increases as the programming level is low, and has the effect of lowering the programming threshold. To prevent this, the programming levels are further spaced out as they are low. The transistors whose programming level is lower than the first characteristic (level 11) are the most subject to reading stress. In the case of a Flash-EEPROM memory, a depletion phenomenon (giving rise to an always-on transistor) may make the memory unusable.

In D1 and D2, the different approaches are presented to limit the risks of use. D1 proposes the use of several reading thresholds, some of which can be used to verify that the writing has been rightly done while others can be used to carry out a reading operation. The thresholds that can be used for the verification of reading are more restrictive that they are for simple read operations. D2 proposes a memory refresh device to compensate for programming drifts.

SUMMARY OF THE INVENTION

To overcome these problems, the invention proposes to limit the bias voltage and the current flowing in a storage transistor. Thus, according to the invention, the reading is done by a gate bias voltage that is equal to the voltage needed to obtain a predetermined reference current in the selected storage transistor. The decoding of the stored piece of data being done by the decoding of the bias voltage. Thus, the invention reduces the current flowing through the transistors during the reading, and reduces the basic biasing electrical stress undergone during each reading.

An object of the invention is to provide an integrated circuit comprising a memory that includes a plurality of bit lines, a plurality of word lines, and a plurality of floating-gate transistors placed at the intersections of the word lines and the bit lines. Each floating-gate transistor stores an electrical state representing a stored piece of data. The memory also includes at least one circuit to compare a current flowing through a selected bit line with a reference current, a voltage generator circuit that generates a growing bias voltage to a gate of at least one floating-gate transistor so long as the current flowing through the bit line is smaller than the reference current, and a decoding circuit that outputs digital information representing the stored piece of data by decoding the value of the bias voltage.

Another object of the invention is also a method for the reading of a memory comprising a plurality of bit lines, a plurality of word lines, and a plurality of floating-gate transistors placed at the intersections of the word lines and the bit lines. Each floating-gate transistor stores an electrical state representing a stored piece of data, wherein the current flowing through a selected bit line is compared with the reference current. A growing bias voltage is generated as long as the current flowing through the bit line is smaller than the reference current. The value of the bias voltage is decoded to give a digital value representing the stored piece of data.

BRIEF DESCRIPTION OF THE DRAWINGS

The invention will be understood more clearly and other features and advantages shall appear from the following description, made with reference to the appended drawings, of which.

DETAILED DESCRIPTION OF THE PREFERRED EMBODIMENTS

Figure 1:
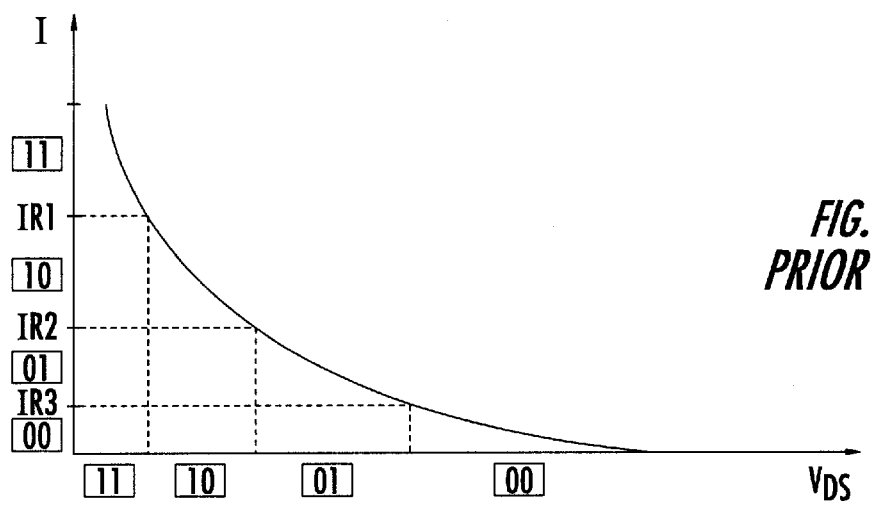
FIG. 1 shows a current/voltage characteristic of the channel of a prior art storage transistor with constant gate voltage depending on different levels of programming.
Figure 2:
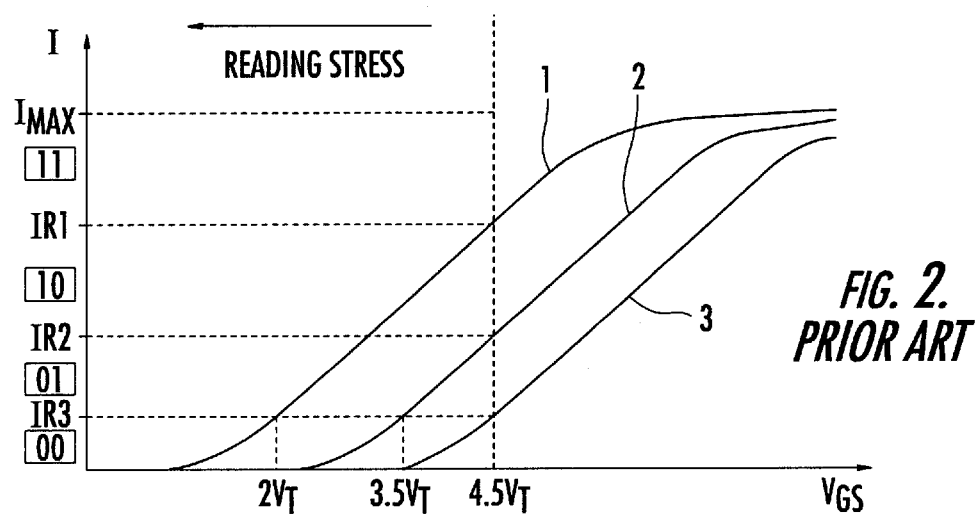
FIG. 2 shows current characteristics as a function of the gate transistor of a programmed storage transistor, at different threshold levels, according to the prior art.
Figure 3:
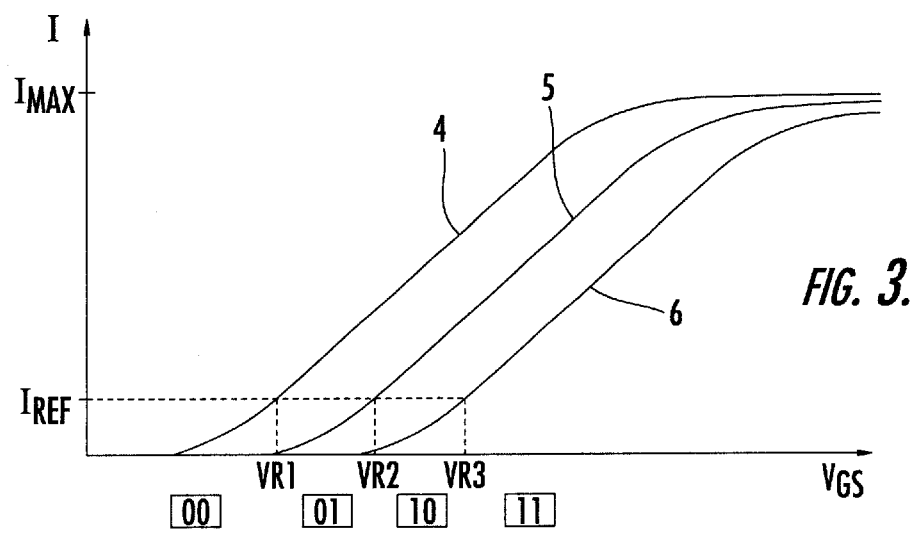
FIG. 3 shows current characteristics as a function of the gate voltage of a programmed storage transistor, at different threshold levels, according to the invention.

FIG. 3 shows an exemplary characteristic curve of current flowing through the channel of the storage transistor as a function of the bias voltage, for storage thresholds according to the invention. This FIG. 3 is similar to FIG. 2. However, those skilled in the art will note that the programming threshold characteristic curves 4 to 6 are closer together than the characteristics 1 to 3. FIG. 3 shows a current IREF corresponding to the current flowing through a storage transistor during a read operation. According to the invention, the decoding is done by decoding the bias voltage needed to obtain the current IREF. The reading is then done by the comparison of the bias voltage with three threshold voltages VR1, VR2 and VR3 which correspond to the programming threshold characteristic curves.

Figure 4:
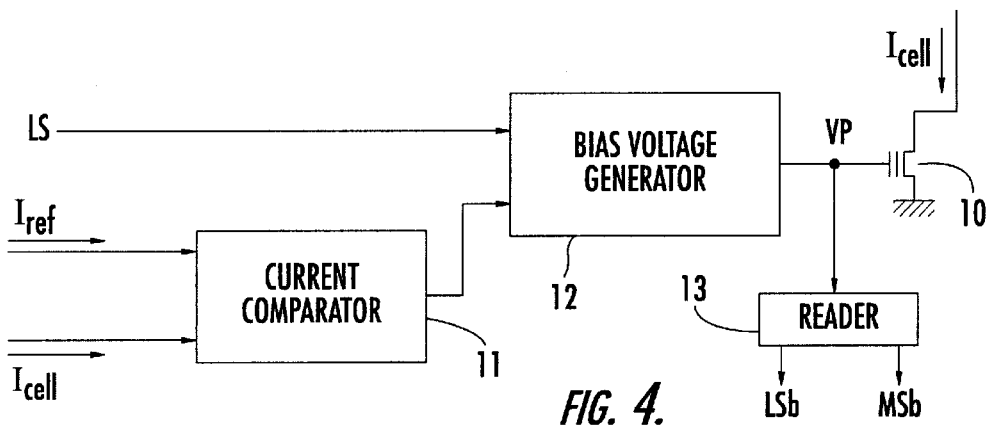
FIG. 4 gives a schematic view of the principle of the reading of a storage transistor according to the invention.

FIG. 4 gives a simplified view of the principle of implementation of the invention. A storage transistor 10 has its channel connected firstly to the ground and, secondly, to the bit line (which, in this case, conveys two bits at a time). A current Icell, going through the channel of the transistor 10, depends firstly on the electrical level stored by the transistor 10 and, secondly, on the gate bias voltage of the transistor 10. A current comparator 11 receives, firstly, the current Icell, coming from the bit line and, secondly, a current Iref corresponding to the maximum current flowing through a storage transistor 10 during a reading operation. The comparator 11 outputs a binary piece of information in a first state when the current Icell is lower than the current Iref or in a second state when the current Icell is higher than the current Iref.

A bias voltage generator 12 receives a selection signal LS and the binary information coming from the comparator 11 to give a bias voltage to the storage transistor 10. The bias voltage is zero when the selection signal is inactive. This results in giving a current Icell that is zero. By contrast, when the election signal becomes active, the bias voltage will increase if the binary information is in the first stage and will then hold at a certain level as soon as the binary information is in the second state. When the signal LS is activated, then the current Icell will increase until it becomes slightly greater than Iref in such a way that the bias voltage of the transistor corresponds precisely to the voltage needed for it to be on.

A read circuit 13 also receives the bias voltage to enable the decoding of the stored information. In the exemplary embodiment, the read circuit converts the bias voltage into a least significant bit LSb and a most significant bit MSb.

Figure 5:
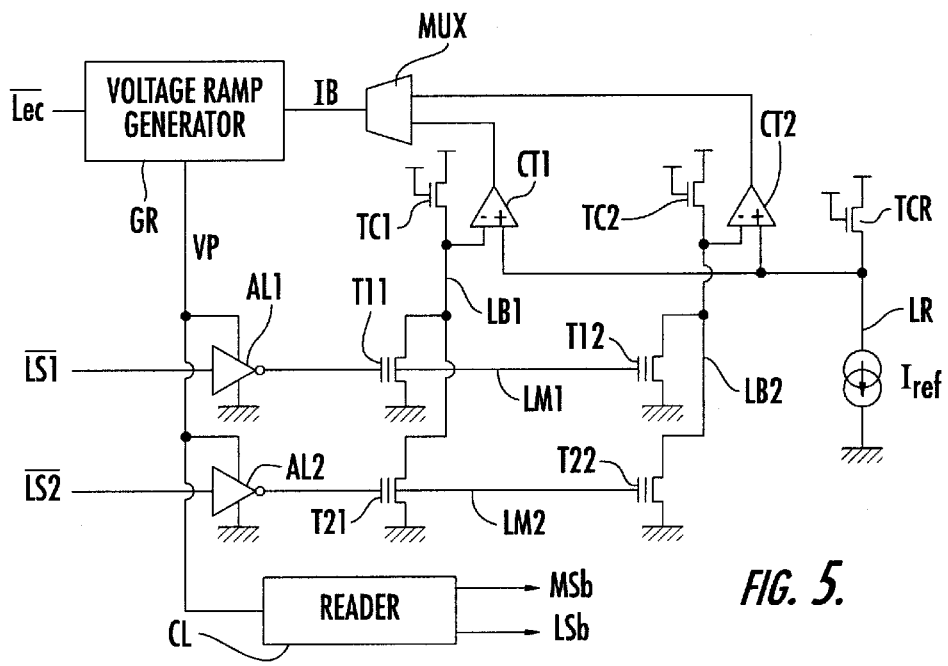
FIG. 5 gives a schematic view of the implementation of the invention on a storage matrix organized in two-bit words.

The drawing of FIG. 5 corresponds to an implementation of the invention in a Flash-EEPROM type memory organized in two-bit words. In this example, each bit line actually carries two bits. In order to simplify the description, only two word lines LM1 and LM2 and two bit lines LB1 and LB2 are shown. It goes without saying that, in a memory, the number of word lines and bit lines is determined as a function of the desired storage capacity.

Four storage transistors T11, T12, T21 and T22 are placed at the intersections formed by the word lines LM1 and LM2 and the bit lines LB1 and LB2. Each of the storage transistors has its source connected to the ground. It has its gate connected to the word line LM1 or LM2 which passes through the intersection at which the transistor is placed. It has its drain connected to the bit line LB1 or LB2 which passes through the intersection at which the transistor is placed. Each of the bit lines LB1 and LB2 has one of its ends connected to a load transistor, TC1 and TC2 respectively, used to bias the bit line during a read operation. The load transistors TC1 and TC2 are used as resistive loads in order to convert the current flowing in each of the bit lines LB1 and LB2 into voltage.

A reference line LR includes a reference load transistor TCR and a current source giving the reference current Iref series-connected between VCC and the ground. The reference load transistor TCR is identical to the load transistors TC1 and TC2. The reference line is used to simulate a bit line at the conduction threshold. With each bit line LB1 and LB2, there is associated a voltage comparator CT1 and CT2. Each voltage comparator CT1 and CT2 has a first input and a second input and an output. The first input of each comparator CT1 and CT2 is connected to the bit line LB1 and LB2 which is associated with the comparator. The second input of each comparator is connected to the reference line LR. The output of each comparator CT1 and CT2 gives a signal in a first state if the voltage present at the first input is higher than the voltage present at the second input or a signal in a second state if the voltage present at the first input is lower than the voltage present at the second input. Those skilled in the art will recognize that unbalanced comparator circuits may be used at input so that in the event of equality between the voltages present at the first and second inputs the output is positioned in the second state.

A multiplexer MUX having two inputs and one output gives a piece of binary information IB that corresponds to the signal given by the comparator CT1 or CT2 associated with the selected bit line. A voltage ramp generator circuit GR receives firstly a piece of binary information IB and secondly a read signal /Lec and gives a bias voltage VP. The read signal /Lec is a signal that is inactive between two read operations and active when a read operation is performed. The bias voltage VP is zero when the read signal /Lec is inactive. It is increasing when the read signal /Lec is active and when the binary information is in the first state and is stable when the read signal /Lec is active and the binary information is in the second state.

With each word line LM1 and LM2, there is associated a line amplifier AL1 and AL2 having an input and an output and being supplied between VP and the ground, the output being respectively connected to the associated word line LM1 or LM2. The line amplifiers AL1 and AL2 are, for example, simple inverters. The input of a line amplifier AL1 and AL2 receives a line selection signal /LS1 and /LS2 respectively, only one of the line selection signals /LS1 and /LS2 being active at a time. When one of the selection signals /LS1 or /LS2 is active (in the low state in the example), the output of the associated line amplifier AL1 or AL2 gives a voltage substantially equal to VP. When one of the selection signals /LS1 or /LS2 is inactive (in the high state in the example), the output of the associated line amplifier AL1 or AL2 gives a zero voltage.

A read circuit CL receives the bias voltage VP and gives a least significant bit LSb and a most significant bit MSb. The read circuit CL may be made in different ways, the principle being the conversion of an analog voltage into two bits (or more) of information.

The reading of a storage transistor is performed as follows:
  the signals /Lec, /LS1 and /LS2 are inactive, the voltage VP is at zero;
  an address is decoded (in decoding circuits not shown but known to those skilled in the art) in such a way that one of the selection signals /LS1 or /LS2 is activated and the multiplexer MUX selects the output of the comparator CT1 or CT2 which corresponds to the bit line to be read;
  the signal /Lec becomes active, the voltage VP will increase so long as the binary information is in the first state namely so long as the current in the selected bit line LB1 or LB2 selected is below the reference current Iref;
  as soon as the binary current goes into the second state (namely as soon as the current in the selected bit line becomes slightly greater than the reference current Iref), then the bias voltage VP is kept at its voltage level and it is possible to read the data element stored at the selected address at output of the read circuit LC.

Figure 6:
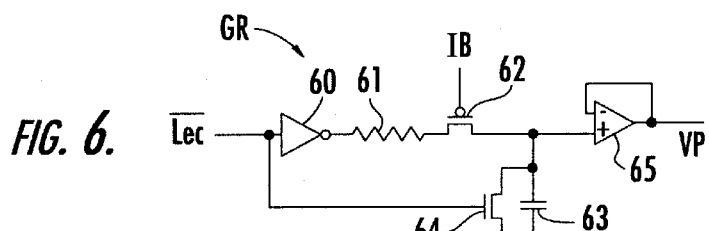
FIG. 6 shows a bias ramp generator according to the invention.

FIG. 6 shows an exemplary embodiment of the ramp generator circuit GR. This is an integrated circuit with locking. A circuit of this kind has an inverter 60, a resistive circuit 61, a first transistor 62, a capacitor 63, a second transistor 64 and an operational amplifier 65. The resistive circuit 61 is placed between the source of the first transistor 62 and the output of the inverter 60. The capacitor 63 is placed between the drain of the first transistor 62 and the ground. The channel of the second transistor 64 is parallel-connected with the capacitor 63. Its gate is connected to the input of the inverter 60 and receives the read signal /Lec. The operational amplifier 65 is mounted as a follower and connected to the node formed by the drain of the first transistor 62 and a capacitor terminal 63. The first transistor receives the binary information IB at its gate.

In the example shown, it is specified that the active level of the signal /Lec corresponds to a low level (0 volts) and the first state of the binary information IB is also at a low level. Those skilled in the art will easily understand the operation of such a circuit. The basic principle lies in discharging the capacitor 63 as fast as possible when the read signal /Lec is inactive (this is the role of the second transistor 64) and then in charging the capacitor 63 at a certain speed (controlled by the resistive circuit 61 and the capacitance of the capacitor 63). The storing of the voltage is then done by opening the load circuit of the capacitor 63 by opening the first transistor 62, with the operational amplifier 65 mounted as a follower being used to recover the voltage at the terminal of the capacitor 63 while at the same time insulating the capacitor. The circuit of FIG. 6 may be replaced by numerous equivalent circuits. What is important is to give a voltage ramp in a controlled way.

Figure 7:
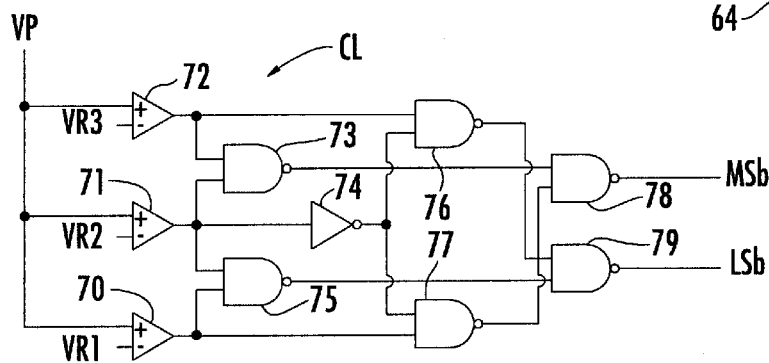
FIG. 7 shows read circuit according to the invention.

FIG. 7 shows an example of a read circuit CL. This read circuit has three voltage comparators 70 to 72 which compare the bias voltage VP with three voltage thresholds VR1 to VR3 that correspond to the programming threshold characteristics shown in FIG. 3. Combinational logic circuits 73 to 79 are connected to the output of the three voltage comparators 70 to 72 and perform a logic decoding to obtain the most significant bit MSb and the least significant bit LSb. There are many equivalent circuits that can be substituted for this circuit, especially for reasons related to the choice of the association of binary values with a particular electrical level.

Figure 8:
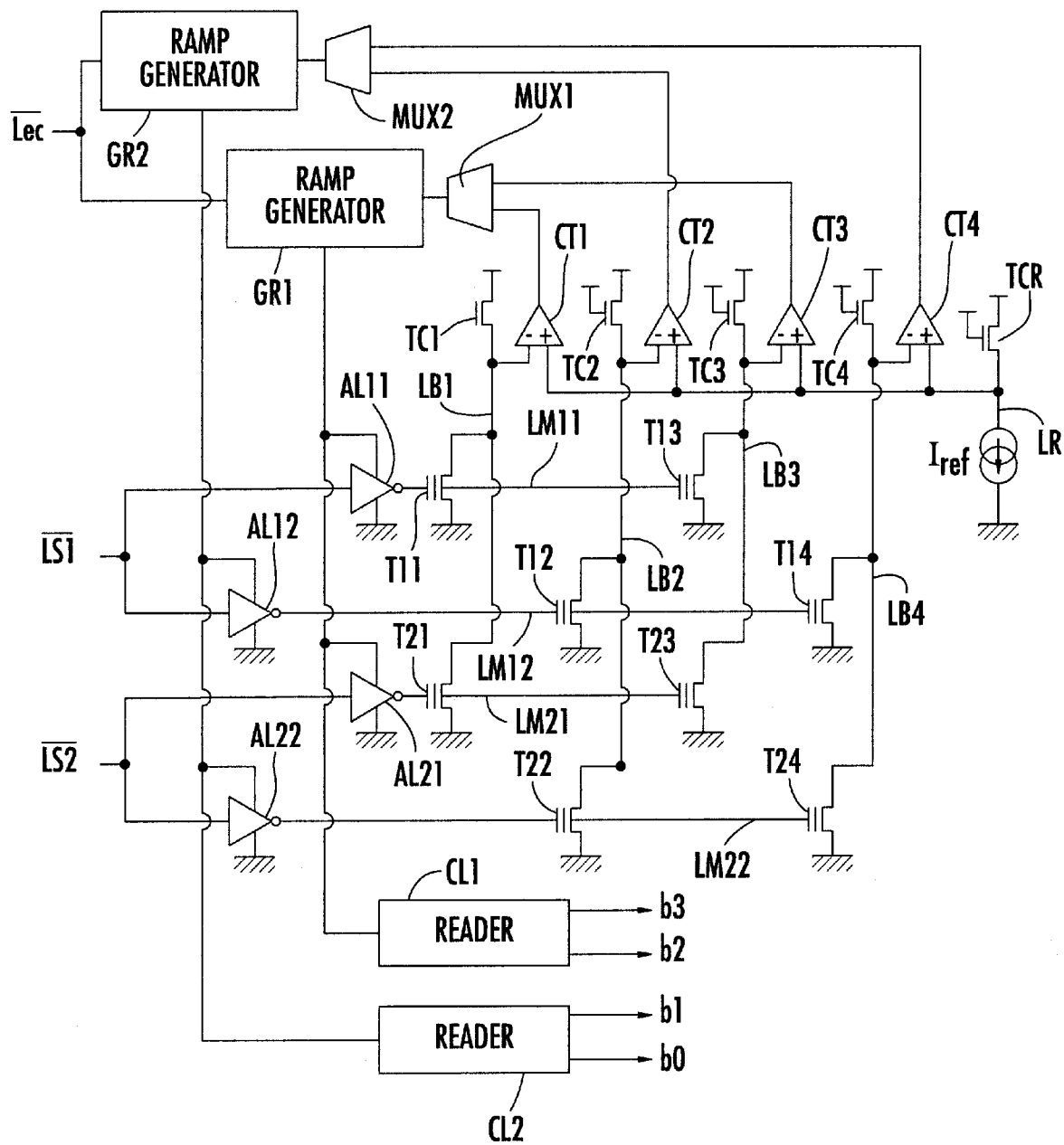
FIG. 8 gives a schematic view of the implementation of the invention on a storage matrix organized in four-bit words.

FIG. 8 shows a Flash-EEPROM type memory organized in four-bit words. The reference labels that are similar to the reference labels of FIG. 5 correspond to identical elements. This figure should indicate to those skilled in the art how to organize a storage matrix in words of more than two bits. Those skilled in the art may note that the word lines LM11 to LM22 are duplicated to enable the decoding of the bias voltages of the two bit lines LB1 and LB2 or LB3 and LB4 which correspond to one and the same word simultaneously. This leads to a duplication of the ramp generators GR1 and GR2, the multiplexers MUX1 and MUX2 and the read circuits CL1 and CL2.

Figure 9:
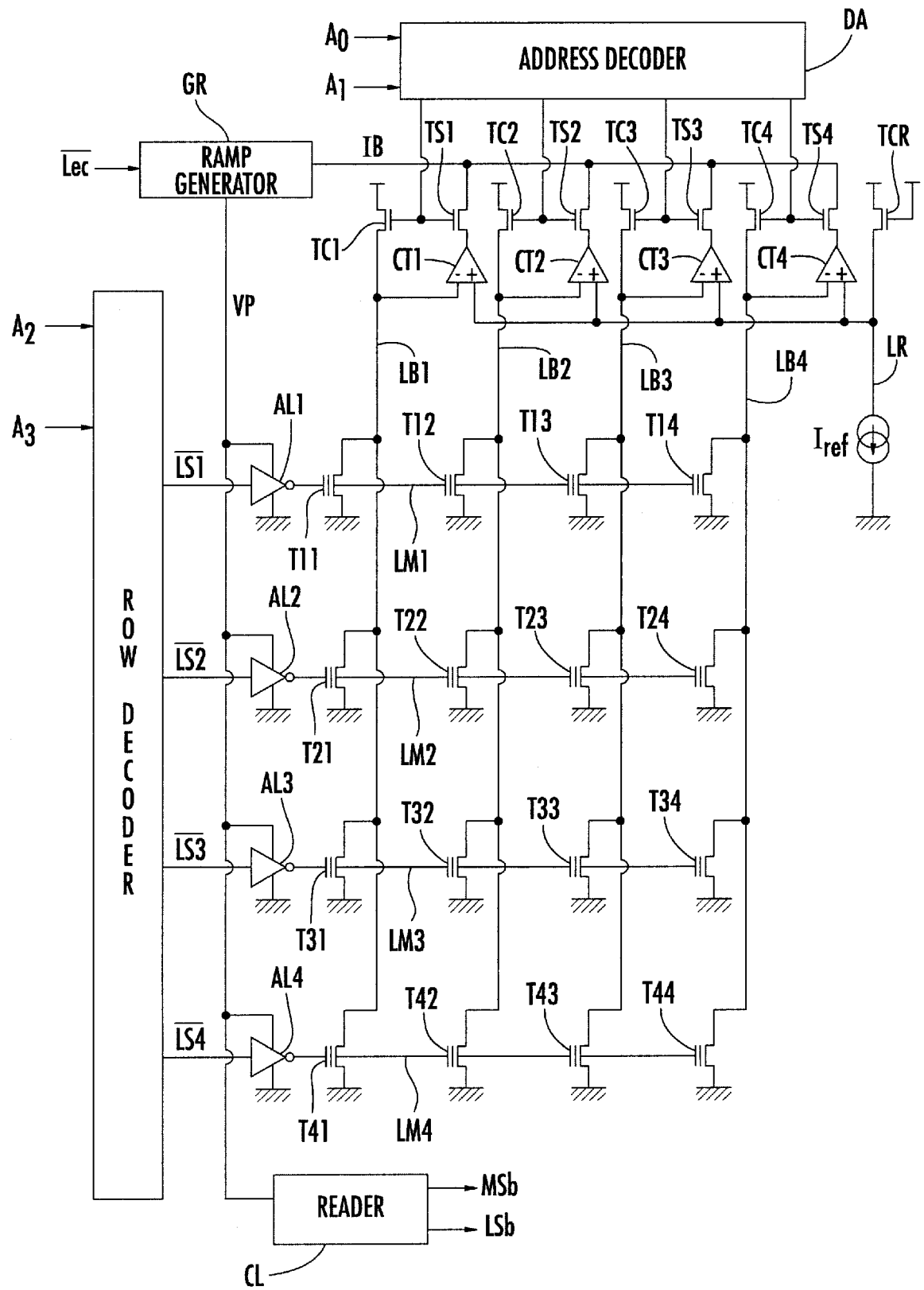
FIG. 9 shows a variant of the invention.

The diagram of FIG. 9 corresponds to a storage matrix organized in two-bit words. This FIG. 9 is similar to FIG. 5. At the same time, it represents a storage matrix of greater size. The main value of this FIG. 9 is that it shows an improvement in the memory of FIG. 5. In FIG. 9, it can be seen that the multiplexer is replaced by selection transistors TS1 to TS4 controlled by an address decoder DA. The load transistors TC1 to TC4 associated respectively with each bit line LB1 to LB4 are connected to power-on or not power-on the bit lines LB1 to LB4 with which they are associated. The gates of the transistors TC1 to TC4 are connected to the address decoder DA so that only the bit line read is powered-on.

The operation of the memory shown in this FIG. 9 is similar to the operation of the memory shown in FIG. 5. However, only the bit line selected has its charge transistor that is on. This has the effect of eliminating the current flowing through the storage transistors of the selected word line. Thus, during a read operation, only the bit line to be read is powered-on. Thus, with the memory of FIG. 9, when the reading of the transistor T23 is done, the bias voltage is received at the base of the storage transistors T21 to T24 of the word line LM2 but only the transistor T23 is crossed by a current. The reading done according to the invention subjects the storage transistors of the same word line to a mean electrical stress lower than that known in the prior art and without the storage transistors and the word line being crossed by a current. The stress of the storage transistor that is read for its part is reduced to the minimum necessary, the current being also reduced to the minimum.

Figure 10:
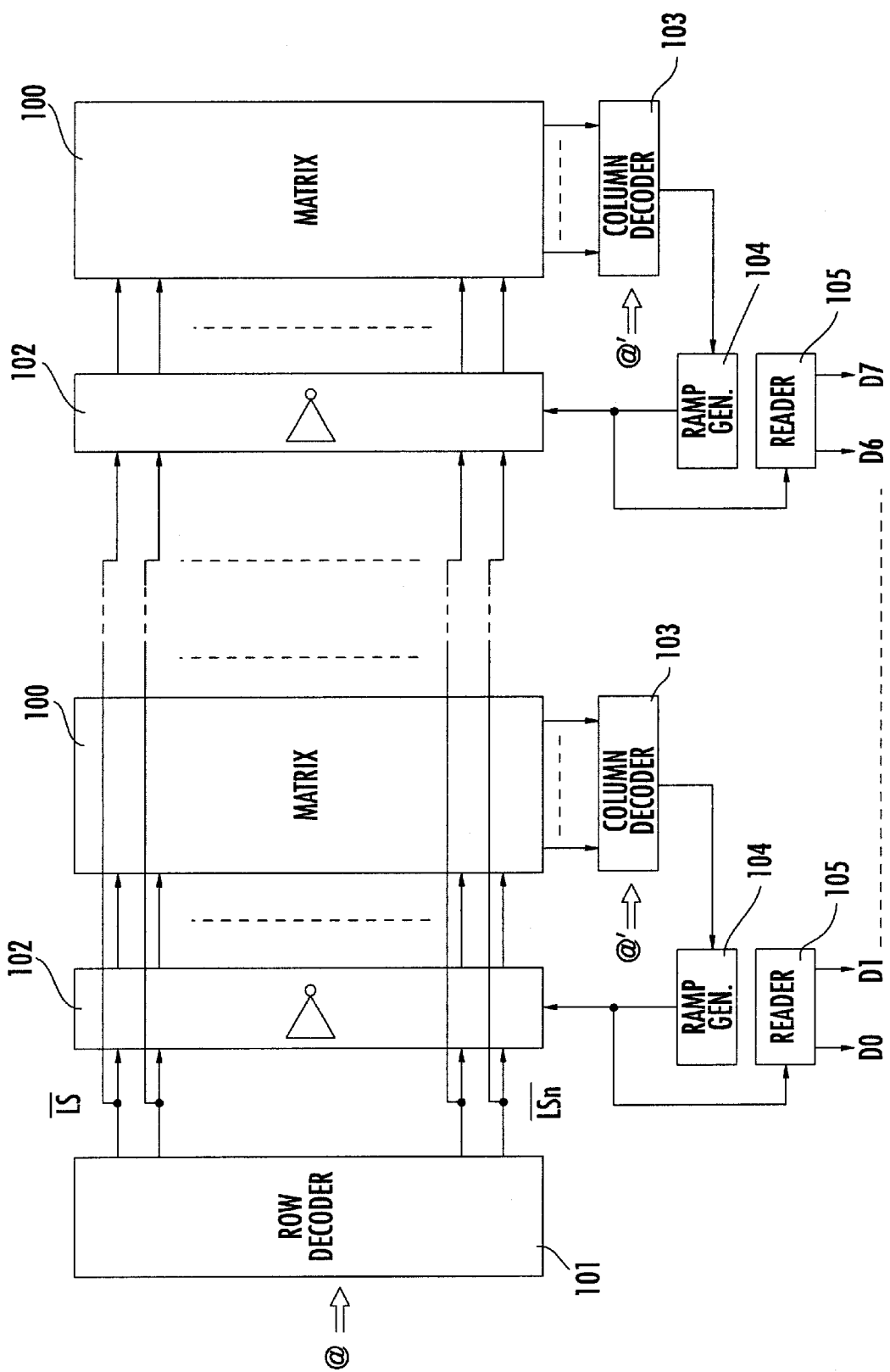
FIG. 10 gives a schematic view of the implementation of the invention for a memory organized in words of any size using a plurality of storage matrices.

FIG. 10 shows an implementation of the invention for a memory organized in words of any size using a plurality of storage matrices 100. Each matrix 100 is organized in two-bit words. The memory of FIG. 10 further has a row decoder circuit 101, line amplifier circuits 102 associated with each matrix 100, column decoders 103 associated with each matrix 100, ramp generators 104 associated with each matrix 100 and read circuits 105 associated with each matrix 100. If the diagram of FIG. 10 is considered to have only one matrix, it becomes the equivalent of the circuit of FIG. 5 or the circuit of FIG. 9. The operation of a memory of FIG. 10 amounts to obtaining a parallel operation of several memories of the FIG. 9 using a single row decoder.

Figure 11:
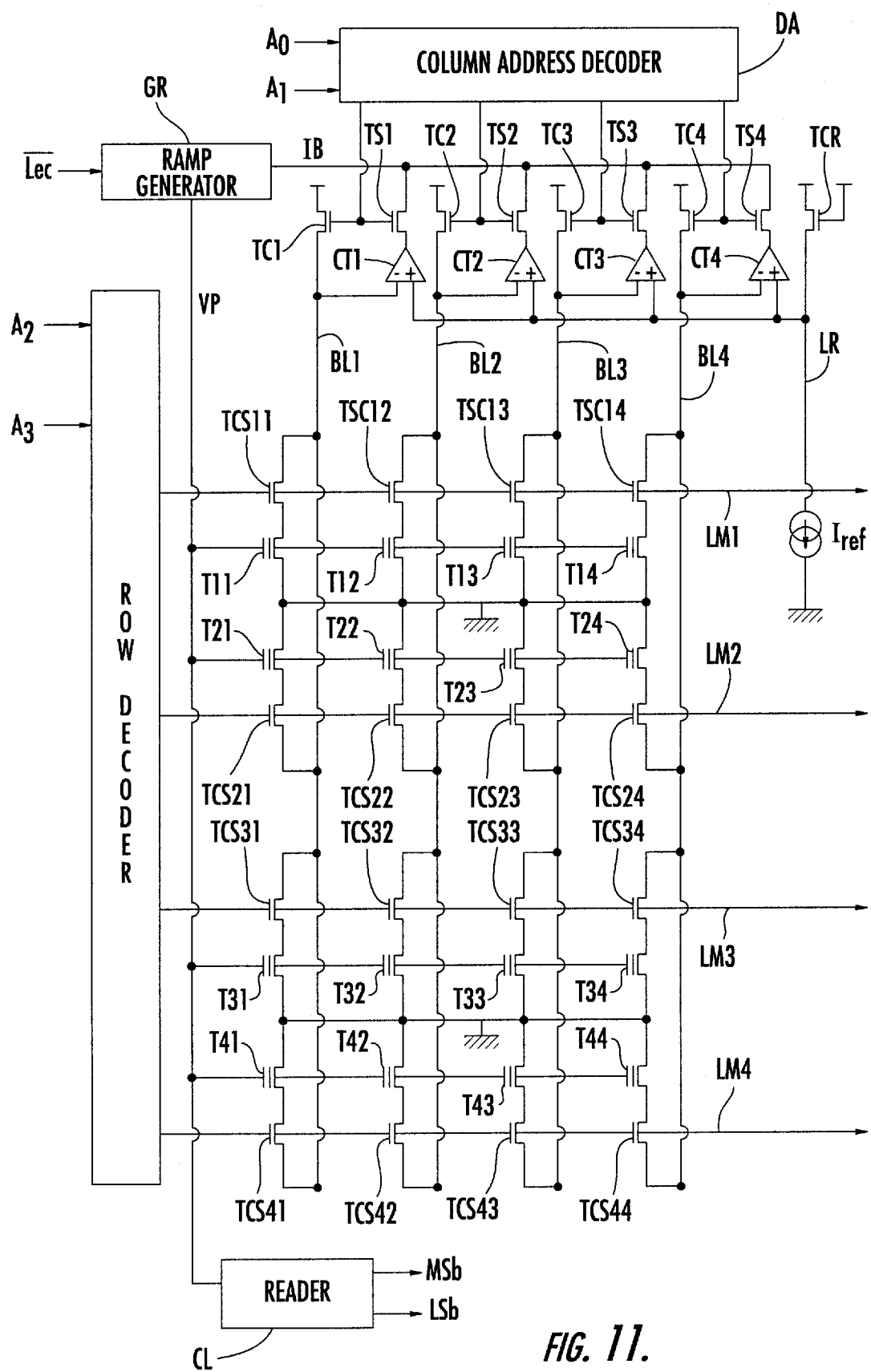
FIG. 11 shows a variation of the invention.

FIG. 11 shows an EEPROM type memory made according to the invention. This memory can be distinguished from the Flash-EEPROM memory of FIG. 9 by a storage cell comprising a storage transistor T11 to T44 and a cell selection transistor TCS11 to TCS44. Consequently, the word lines LM1 to LM4 are connected to the bases of the cell selection transistors TCS11 to TCS44. The word lines LM1 to LM4 may be directly controlled by the row decoder and may cross the storage matrix. The bases of the storage transistors T11 to T44 may be connected together to the output of the ramp generator GR. This configuration is particularly well suited for making a complete memory as indicated in FIG. 10.

Other alternative embodiments of the invention are possible without in any way thereby going beyond the scope of the invention. In particular, those skilled in the art may make memories of any size. Similarly, the values of the different signals may be very well suited to different technological choices.

What is claimed is:

1. An integrated circuit for a memory including a plurality of bit lines, a plurality of word lines which intersect the plurality of bit lines, and a plurality of floating-gate transistors at intersections of the plurality of word lines and the plurality of bit lines, each floating-gate transistor maintaining an electrical state representing a stored piece of data, the integrated circuit comprising:

at least one comparator to compare a current flowing through a selected bit line of the plurality of bit lines with a reference current;

a voltage generator that generates an increasing bias voltage to a gate of at least one floating-gate transistor when the current flowing through the selected bit line is less than the reference current, and that generates a constant bias voltage to the gate of the at least one floating-gate transistor when the current flowing through the selected bit line is more than the reference current; and a decoder that outputs digital information representing the stored piece of data by decoding a value of the bias voltage.

2. An integrated circuit according to claim 1, wherein the comparator further comprises:

an address decoder; and a plurality of load transistors respectively associated with each bit line of the plurality of bit lines, wherein the load transistor of each bit line is for powering on the bit line with which it is associated, and a gate of the load transistor is connected to the address decoder so that the bit line is powered on when being read.

3. An integrated circuit according to claim 1, wherein the memory is divided into a plurality of storage matrices using a common row decoder.

4. An integrated circuit comprising:

a memory for storing data and including
a plurality of bit lines,
a plurality of word lines which intersect the plurality of bit lines, and
a plurality of floating-gate transistors at intersections of the plurality of word lines and the plurality of bit lines;

a comparator to compare a current in a selected bit line of the plurality of bit lines with a reference current;

a voltage generator that generates a bias voltage to a gate of at least one floating-gate transistor when the current in the selected bit line is less than the reference current; and a decoder for decoding a value of the bias voltage to output information representing stored data.

5. An integrated circuit according to claim 4, wherein each floating-gate transistor maintains an electrical state representing stored data.

6. An integrated circuit according to claim 4, wherein the comparator further comprises:

an address decoder; and a plurality of load transistors connected to the address decoder and respectively associated with each bit line of the plurality of bit lines.

7. An integrated circuit according to claim 6, wherein a gate of each load transistor is connected to the address decoder so that the associated bit line is powered on when being read.

8. An integrated circuit according to claim 4, wherein the memory is divided into a plurality of storage matrices.

9. An integrated circuit according to claim 8, further comprising a row decoder for the plurality of storage matrices.

10. An integrated circuit for reading a memory having bit lines, word lines and floating-gate transistors, the integrated circuit comprising:

a comparator for comparing a current in a bit line with a reference current;

a voltage generator for generating a bias voltage to a gate of at least one floating-gate transistor based on the comparison of the current in the bit line with the reference current; and a decoder for decoding a value of the bias voltage to output information representing stored data.

11. An integrated circuit according to claim 10, wherein each floating-gate transistor of the memory maintains an electrical state representing stored data.

12. An integrated circuit according to claim 10, wherein the comparator further comprises:

an address decoder; and a plurality of load transistors connected to the address decoder and each for association with a respective bit line.

13. An integrated circuit according to claim 12, wherein a gate of each load transistor is connected to the address decoder so that the associated bit line is powered on when being read.

14. An integrated circuit according to claim 10, wherein the memory is divided into a plurality of storage matrices.

15. An integrated circuit according to claim 14, further comprising a row decoder for the plurality of storage matrices.

16. A method for reading a memory comprising a plurality of bit lines, a plurality of word lines which intersect with the plurality of bit lines, a plurality of floating-gate transistors at intersections of the word lines and the bit lines, each floating-gate transistor maintaining an electrical state representing stored data, the method comprising the steps of:

comparing the current flowing through a selected bit line with a reference current;

generating an increasing bias voltage when the current flowing through the selected bit line is less than the reference current, and generating a constant bias voltage when the current flowing through the selected bit line is more than the reference current;

decoding a value of the bias voltage; and outputting a digital value representing the stored data based on the decoded value.

17. A method according to claim 16 wherein only a bit line to be read is powered on during reading.

18. A method for reading a memory having bit lines, word lines and floating-gate transistors, the method comprising the steps of:

comparing a current in a bit line with a reference current;

generating a bias voltage to a gate of at least one floating-gate transistor based on the comparison of the current in the bit line with the reference current; and decoding a value of the bias voltage to output information representing stored data.

19. A method according to claim 18, wherein each floating-gate transistor of the memory maintains an electrical state representing stored data.

20. A method according to claim 18, wherein a bit line is powered on when being read.

21. A method of making an integrated circuit for reading a memory having bit lines, word lines and floating-gate transistors, the method comprising the steps of:

providing a comparator for comparing a current in a bit line with a reference current;

providing a voltage generator for generating a bias voltage to a gate of at least one floating-gate transistor based on the comparison of the current in the bit line with the reference current; and providing a decoder for decoding a value of the bias voltage to output information representing stored data.

22. A method according to claim 21, wherein each floating-gate transistor of the memory maintains an electrical state representing stored data.

23. A method according to claim 21, wherein the step of providing the comparator further comprises:

providing an address decoder; and providing a plurality of load transistors connected to the address decoder and each for association with a respective bit line.

24. A method according to claim 23, wherein a base of each load transistor is connected to the address decoder so that the associated bit line is powered on when being read.

25. A method according to claim 21, wherein the memory is divided into a plurality of storage matrices.

26. A method according to claim 25, further comprising the step of providing a row decoder for the plurality of storage matrices.

* * * * *